(12) United States Patent
Thothadri et al.

(10) Patent No.: US 10,859,870 B2
(45) Date of Patent: Dec. 8, 2020

(54) 3D DISPLAYS

(71) Applicant: Applied Materials, Inc., Santa Clara, CA (US)

(72) Inventors: Manivannan Thothadri, Mountain View, CA (US); Arvinder Chadha, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/257,379

(22) Filed: Jan. 25, 2019

(65) Prior Publication Data

US 2019/0391448 A1 Dec. 26, 2019

Related U.S. Application Data

(60) Provisional application No. 62/690,173, filed on Jun. 26, 2018.

(51) Int. Cl.
*G02F 1/1335* (2006.01)
*G02F 1/13357* (2006.01)
(Continued)

(52) U.S. Cl.
CPC ....... *G02F 1/133603* (2013.01); *G02B 27/30* (2013.01); *G02B 30/00* (2020.01);
(Continued)

(58) Field of Classification Search
CPC ........ G02B 27/30; G02B 30/00; G02B 30/33; G02B 2207/123; G02B 27/4233;
(Continued)

(56) References Cited

U.S. PATENT DOCUMENTS 7,502,168 B2 3/2009 Akutsu et al.
8,233,204 B1 7/2012 Robbins et al.
(Continued)

FOREIGN PATENT DOCUMENTS

KR 10-0657330 B1 12/2006
KR 20160015832 A * 2/2016
(Continued)

OTHER PUBLICATIONS

Is QDOG the Future of LCD TV?, https://www.displaysupplychain.com/blog/is-qdog-the-future-of-lcd-tv, Dec. 4, 2017 (Year: 2017).*
(Continued)

*Primary Examiner* — Stacy Khoo
(74) *Attorney, Agent, or Firm* — Patterson + Sheridan LLP

(57) ABSTRACT

Embodiments described herein relate to three dimensional (3D) display apparatus. In one embodiment, the 3D display apparatus include a polychromatic backlight unit comprising an emissive light source, a collimator comprising a plurality of collimating features coupled to and in optical communication with the backlight unit, and a diffractive element comprising a plurality of gratings coupled to and in optical communication with the collimator. In other embodiments, the 3D display apparatus includes a monochromatic backlight unit, an LCD module, and a quantum dot containing film.

20 Claims, 7 Drawing Sheets

(51) Int. Cl.
  *G02B 27/30*  (2006.01)
  *H01L 27/32*  (2006.01)
  *H01L 27/12*  (2006.01)
  *G02B 30/00*  (2020.01)

(52) U.S. Cl.
  CPC .. *G02F 1/133504* (2013.01); *G02F 1/133528* (2013.01); *H01L 27/124* (2013.01); *H01L 27/3211* (2013.01)

(58) Field of Classification Search
  CPC ......... G02F 1/133504; G02F 1/133528; G02F 1/133603; H01L 27/124; H01L 27/3211; H01L 51/5262
  See application file for complete search history.

(56) References Cited

U.S. PATENT DOCUMENTS

| | | | |
|---|---|---|---|
| 8,643,928 | B2 | 2/2014 | Robinson |
| 9,671,566 | B2 | 6/2017 | Abovitz et al. |
| 2006/0227259 | A1* | 10/2006 | Mi ...................... G02B 6/0053 349/61 |
| 2010/0141868 | A1 | 6/2010 | St. Hilaire et al. |
| 2011/0317399 | A1* | 12/2011 | Hsu ...................... G02F 1/1323 362/97.1 |
| 2012/0188791 | A1 | 7/2012 | Voloschenko et al. |
| 2015/0048348 | A1 | 2/2015 | Huang et al. |
| 2016/0216557 | A1* | 7/2016 | Rho .................. G02F 1/133528 |
| 2016/0327822 | A1 | 11/2016 | Huang et al. |
| 2017/0167703 | A1* | 6/2017 | Cok ...................... F21V 23/003 |
| 2017/0371090 | A1 | 12/2017 | Fattal |
| 2018/0011237 | A1 | 1/2018 | Fattal |
| 2018/0031917 | A1* | 2/2018 | Niu .................. G02F 1/133621 |
| 2018/0072892 | A1* | 3/2018 | Armon ................ C09B 67/0076 |
| 2018/0172893 | A1 | 6/2018 | Fattal et al. |
| 2018/0299793 | A1 | 10/2018 | Ye et al. |

FOREIGN PATENT DOCUMENTS

| | | | |
|---|---|---|---|
| KR | 10-2018-0009568 A | 1/2018 | |
| WO | WO-2018022028 A1 * | 2/2018 | ............. G02B 6/005 |

OTHER PUBLICATIONS

International Search Report and Written Opinion for International Application No. PCT/US2019/030176 dated Aug. 16, 2019.

* cited by examiner

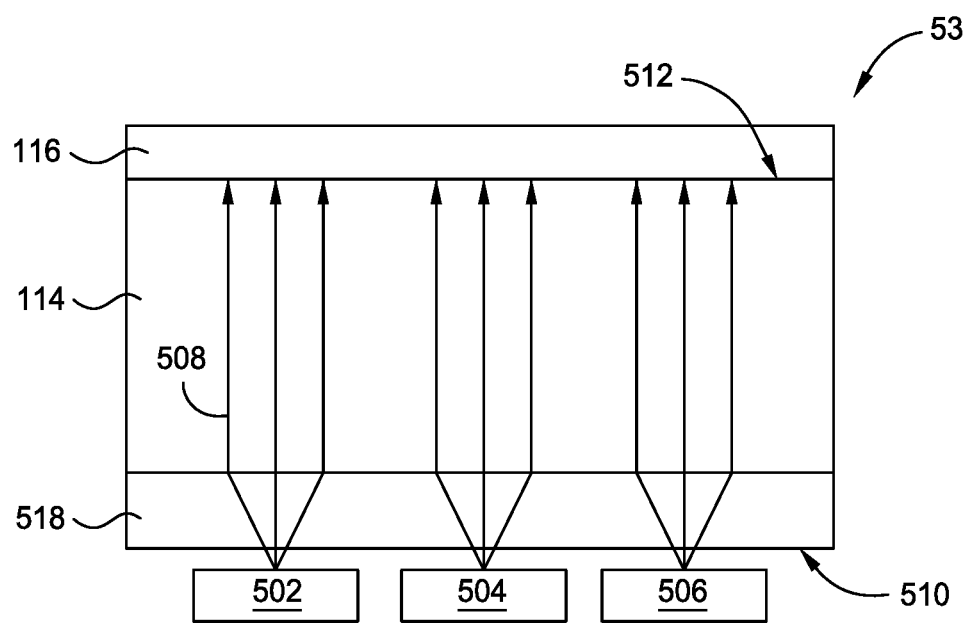
FIG. 5C
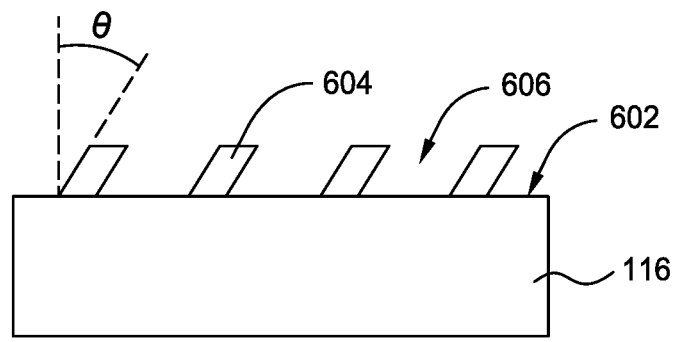
FIG. 6A
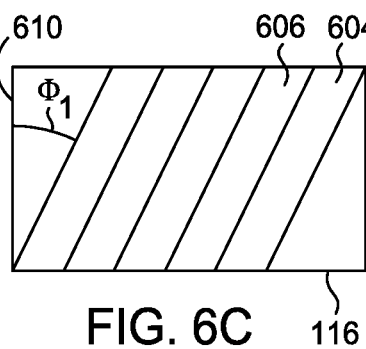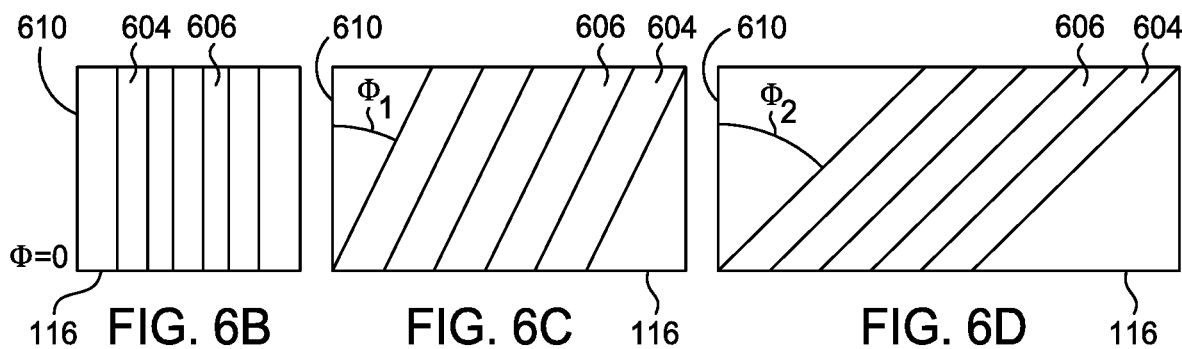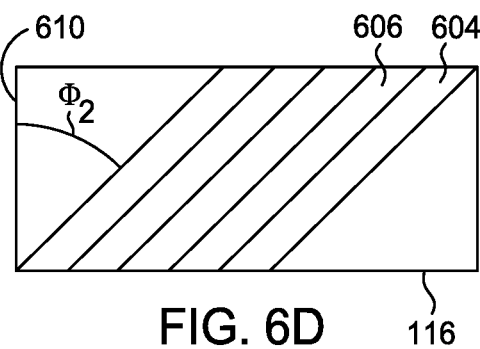
FIG. 6B  FIG. 6C  FIG. 6D

3D DISPLAYS

CROSS-REFERENCE TO RELATED APPLICATIONS

This application claims benefit of U.S. provisional patent application Ser. No. 62/690,173, filed Jun. 26, 2018, which is herein incorporated by reference in its entirety.

BACKGROUND

Field

Embodiments of the present disclosure generally relate to three-dimensional (3D) displays. More specifically, embodiments described herein relate to autostereoscopic 3D displays.

Description of the Related Art

Three dimensional (3D) displays have gained popularity in recent years in response to users' desires for a more life-like and immersive viewing experience. 3D image display apparatus utilize the phenomena of binocular disparity to display 3D images. Conventional binocular disparity 3D image display apparatus display 3D images by providing left-eye and right-eye images having different viewpoints to the left and right eyes of the viewer. Such displays are commonly referred to as "glasses-type" 3D displays because the viewer wears glasses which enable the viewer to view the displayed images in 3D. Examples of glasses-type 3D displays include glasses based on anaglyph red/green, active shutter, or polarizing glasses used in conjunction with a television.

While glasses-type displays have found some commercial success, widespread adoption of such displays has been limited, due to a lack of color purity, dizziness and headaches of the user wearing the glasses, and the fact that many viewers don't want to wear bulky and/or costly glasses when viewing the display.

In addition, binocular disparity is just one of the cues that the human brain uses to perceive depth. Several other binocular and monocular cues and their interactions are relevant for a comfortable and "natural" 3D viewing experience. Some of the additional cues include convergence of the two eye-balls at the same point (binocular cue), accommodation or focus of the eye at the converged point, parallax and occlusion, retinal blur, shading, color, texture, size, lighting, gradient, etc. Correct coordination and syncing of the cues results in a suitable 3D display. While conventional 3D displays are suitable for solving or utilizing binocular disparity to enable 3D perception, dizziness and headaches result when convergence and accommodation cues are in conflict. Conventional 3D display are inherently unsuited to display multiple perspectives or viewing angles to each eye as each pixel within conventional displays are engineered to emit light isotropically in all directions.

Thus, what is needed in the art are improved 3D display apparatus.

SUMMARY

In one embodiment, a display apparatus is provided. The apparatus includes a polychromatic backlight unit comprising an emissive light source, a collimator comprising a plurality of collimating features coupled to and in optical communication with the backlight unit, and a diffractive element comprising a plurality of gratings coupled to and in optical communication with the collimator.

In another embodiment, a display apparatus is provided. The apparatus includes a monochromatic backlight unit comprising an emissive light source, an LCD module coupled to and in optical communication with the backlight unit, and a thin film transistor backplane assembly disposed between the backlight unit and the LCD module. The apparatus also includes a collimator comprising a plurality of collimating features coupled to and in optical communication with the LCD module and a diffractive element comprising a plurality of gratings coupled to and in optical communication with the collimator.

In yet another embodiment, a display apparatus is provided. The apparatus includes a monochromatic backlight unit comprising an emissive light source, a quantum dot containing film coupled to the backlight unit, an LCD module in optical communication with the backlight unit, and a thin film transistor backplane assembly coupled to the LCD module. The apparatus also includes a collimator comprising a plurality of collimating features in optical communication with the LCD module and a diffractive element comprising a plurality of gratings coupled to and in optical communication with the collimator.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5C illustrates a schematic view of a light guide according to an embodiment of the disclosure.

FIG. 6A illustrates a schematic view of a diffractive element according to an embodiment of the disclosure.

FIG. 6B illustrates a schematic top view of a diffractive element according to an embodiment of the disclosure.

FIG. 6C illustrates a schematic top view of a diffractive element according to an embodiment of the disclosure.

FIG. 6D illustrates a schematic top view of a diffractive element according to an embodiment of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to three dimensional (3D) display apparatus. In one embodiment, the 3D display apparatus includes a polychromatic backlight unit comprising an emissive light source, a collimator comprising a plurality of collimating features coupled to and in optical communication with the backlight unit, and a diffractive element comprising a plurality of gratings coupled to and in optical communication with the collimator. In other embodiments, the 3D display apparatus includes a monochromatic backlight unit, an LCD module, and a quantum dot containing film.

Figure 1:
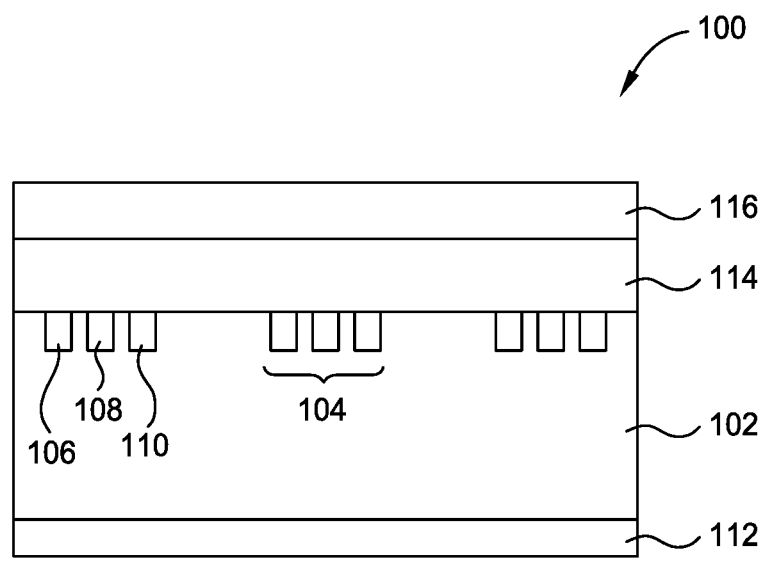
FIG. 1 illustrates a schematic view of a display stack according to an embodiment of the disclosure.

FIG. 1 illustrates a schematic view of a display stack 100 according to an embodiment of the disclosure. In one embodiment, the display stack 100 is configured to generate a three dimensional (3D) image in a viewing zone spaced from the display stack 100. In one embodiment, all or substantially all of the pixels of the display stack 100 are visible to a viewer. The display stack 100 is contemplated to be part of a 3D display apparatus which further includes one or more of an encapsulating glass layer, a touch film, antireflective coatings, and smudge resistant coatings or the like.

The display stack 100 includes a light source 102, a collimator 114, a diffractive element 116, and a thin film transistor (TFT) backplane assembly 112. In one embodiment, the collimator 114 is coupled to and in optical communication with the light source 102. In another embodiment, the collimator 114 is disposed on and in contact with the light source 102. The diffractive element 116 is coupled to and in optical communication with the collimator 114. In one embodiment, the diffractive element 116 is disposed on and in contact with the collimator 114. The TFT backplane assembly 112 is coupled to the light source 102 opposite the collimator 114. In one embodiment, the TFT backplane assembly 112 is disposed on and in contact with the light source 102.

The light source 102 includes one or more emissive light sources 106, 108, 110. In one embodiment, the light source 102 is a polychromatic light source. The light sources 106, 108, 110 include one or more of a light emitting diode (LED) light source, an organic light emitting diode (OLED) light source, a micro LED light source, a quantum dot on glass (QDOG) light source, a laser source, or a laser diode light source. The light sources 106, 108, 110, are considered to be electroluminescent and emit light upon application of electric current to the light sources 106, 108, 110, for example, by the TFT backplane assembly 112 which is configured to drive the light sources 106, 108, 110.

In one embodiment, the light sources 106, 108, 110 are diode light sources. In this example, the light source 106 is a red light emitting diode, the light source 108 is a green light emitting diode, and the light source 110 is a blue light emitting diode. It is contemplated that locations of the light sources 106, 108, 110 are interchangeable with one another such that various spatial arrangements of the light sources 106, 108, 110 may be utilized in accordance with the embodiments described herein.

In another embodiment, light emitted by the light sources 106, 108, 110 is polarized. Alternatively, light emitted by the light sources 106, 108, 110 is partially polarized or unpolarized. In one embodiment, the light sources 106, 108, 110, taken together, correspond to a pixel region 104 of the display stack 100. It is contemplated that the pixel region 104 is not limited to red, blue, and green, and thus may include additional colors, such as cyan and/or magenta to improve a color gamut of the light source 102.

Although not illustrated, the display stack 100 is contemplated to include one or more polarizers, such as a linear polarizer to orient a propagation direction of light emitted from the light sources 106, 108, 110 and/or block internally reflected ambient light to improve a contrast ratio of light emitted by the light source 106, 108, 110. In another embodiment, the polarizer is a circular polarizer. In another embodiment, although not illustrated, the display stack 100 includes a back reflector to redirect the light from the emissive light source 102 toward the diffractive element 116. The display stack 100 may also include quantum dot containing films, such as a quantum dot color filter or a quantum dot enhancement film, depending upon the desired implementation. In one embodiment, the quantum dot containing film is disposed between the light source 102 and the collimator 114.

In operation, the display stack 100 generates an image for 3D display when a signal is received by the TFT backplane assembly 112 which causes one or more of the light sources 106, 108, 110 to emit light. Light emitted by the light sources 106, 108, 110, which is diffuse in nature, propagates through the collimator 114 where the light is collimated. The collimator 114 collimates the light at a near zero propagation angle that is incident on the diffractive element 116. The collimated light then propagates through the diffractive element 116 where the light is diffracted in a predetermined angular orientation to create an image or portion of an image suitable for viewing in 3D. Such images suitable for viewing in 3D are considered to be spatially multiplexed light fields.

Figure 2:
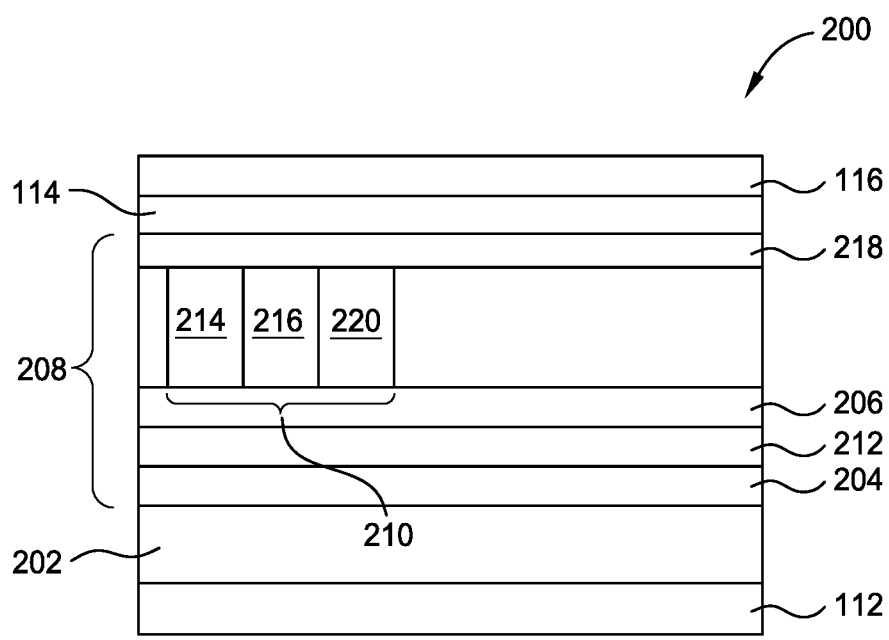
FIG. 2 illustrates a schematic view of a display stack according to an embodiment of the disclosure.

FIG. 2 illustrates a schematic view of a display stack 200 according to an embodiment of the disclosure. In one embodiment, the display stack 200 is configured to generate a three dimensional (3D) image in a viewing zone spaced from the display stack 200 at which all or substantially all pixels of the display stack 200 are visible to the viewer. The display stack 200 is contemplated to be part of a 3D display apparatus which further includes one or more of an encapsulating glass layer, a touch film, antireflective coatings, and smudge resistant coatings or the like.

The display stack 200 includes a light source 202, the collimator 114, the diffractive element 116, an LCD module 208, and the thin film transistor (TFT) backplane assembly 112. In one embodiment, the collimator 114 is coupled to and in optical communication with the light source 202. The diffractive element 116 is coupled to and in optical communication with the collimator 114. In one embodiment, the diffractive element 116 is disposed on and in contact with the collimator 114.

The light source 202 is an emissive light source. In one embodiment, the light source 202 is a monochromatic light source. In another embodiment, the light source 202 includes one or more of a light emitting diode (LED) light source, an organic light emitting diode (OLED) light source, a micro LED light source, or a laser diode light source. The light source is considered to be electroluminescent and emit light upon application of electric current to the light source 202. In one embodiment, the light source 202 is a diode light source. In this example, the light source 202 is a blue light emitting diode. The TFT backplane assembly 112 is coupled to and operable to drive the light source 202.

The LCD module 208 in the display stack 200 includes a liquid crystal display (LCD) cell 206, a first polarizer 204, a second polarizer 218 crossed with the first polarizer 204, the TFT backplane assembly 112 driving the LCD cell 206, and a color filter pixel 210. The color filter pixel 210 includes subpixel color filters 214, 216, 220. The LCD cell 206 includes a film comprising liquid crystals which can be oriented in a predetermined direction upon application of an electric current to allow light to pass through the LCD cell 206. The liquid crystals can also be oriented, by the application of electric current, to prevent light from propagating through the LCD module 208.

In one embodiment, the LCD module 208 includes the plurality of color filters 214, 216, 220. The color filters 214, 216, 220 are utilized to modulate a wavelength of light emitted from the light source 202 to generate light of a desired color different from a color of light emitted from the light source 202. In one embodiment, the color filters 214, 216, 220 are separated by a black matrix to prevent or substantially reduce mixing of colors from adjacent color filters.

In one embodiment, the light source 202 emits blue light which propagates through a pixel region 210 without wavelength modulation by the color filters 214, 216, 220. In this embodiment, the color filter 214 is a red quantum dot infiltrated color filter, the color filter 216 is a green quantum dot infiltrated color filter, and the color filter 220 is an empty filter to enable propagation of blue light through the color filter 220. In another embodiment, the color filter 220 is a blue color filter, a polymer having blue quantum dots dispersed therein, or a polymer exhibiting minimal attenuation of blue light. The spatial arrangement and ordering of the color filters 214, 216, 220 is interchangeable. In another embodiment, the light source 202 emits a plurality of colors and includes the light source 106, 108, 110. In this embodiment, the color filter 214 is a red color filter, the color filter 216 is a green color filter, and the color filter 220 is a blue color filter. The spatial arrangement and ordering of the color filters 214, 216, 220 are interchangeable.

In embodiments where the color filters 214, 16, 220 are quantum dot color filters, the quantum dot color filters includes quantum dot particles. The quantum dot particles are photoluminescent and emit light upon excitation of the particles from light propagating through the LCD module 208 from the light source 202. It is contemplated that the quantum dot color filters are utilized to enhance the color depth and/or color saturation characteristics of light propagating through the display stack 200.

The display stack 200 also includes an LCD TFT backplane assembly 212 coupled to the LCD cell 206 opposite the collimator 114. In one embodiment, the LCD TFT backplane assembly 212 is disposed on and in contact with the LCD module 208. In operation, light emitted by the LCD cell 206 propagates through the collimator 114 where the light is collimated. When a signal is received by the LCD TFT backplane assembly 212, the LCD cell 206 modulates the light propagating therethrough to control the flow of light passing through the color filters 214, 216, 220. The light emanating from the color filters 214, 216, 220 is incident on the collimator 114 which enables near normal incidence on the diffractive element 116. The diffractive element 116, which may be one or a plurality of diffractive elements, directs the light in a predetermined orientation, thus facilitating generation of an image with desired color characteristics for 3D display.

The first polarizer 204 is disposed between the light source 202 and the LCD TFT backplane assembly 212. In one embodiment, the first polarizer 204 is disposed on and in contact with both of the light source 202 and the LCD TFT backplane assembly 212. The second polarizer 218 is disposed between the LCD cell 206 and the collimator 114, for example, beneath and in contact with the collimator 114. In one embodiment, the second polarizer 218, which may be considered to be part of the LCD module 208, is disposed on and in contact with both the color filters 214, 216, 220 and the collimator 114. The first polarizer 204 and the second polarizer 218 are configured to polarize or otherwise alter the propagation direction of light passing therethrough. In certain embodiments, one or both of the first polarizer 204 and/or the second polarizer 218 are optional. Thus, it is contemplated that the display stack 200 may function with or without the first polarizer 204 and/or the second polarizer 218, depending upon the desired implementation.

In operation, light emitted by the light source 202, which is diffuse in nature, propagates through the LCD module 208 and the collimator 114 where the light is collimated. The collimator 114 collimates the light at a near zero propagation angle that is incident on the diffractive element 116. The collimated light then propagates through the diffractive element 116 where the light is diffracted in a predetermined angular orientation to create an image or portion of an image suitable for viewing in 3D.

Light emanating from the individual color filters 214, 216, 220 is directed toward a specific diffractive element, for example, the diffractive element 116. In one configuration, the diffractive element 116, which may include multiple diffractive elements, is placed in a deterministic fashion about the color filters 214, 216, 220. For example, near 100% of the light emanating from the red, blue, and green color filters (e.g. color filters 214, 216, 220) impinges upon a predetermined diffractive element pixel. In one embodiment, the diffractive element 116 is placed in a probabilistic fashion about the color filters 214 216, 220. For example, the red, green, and blue light emanating from the color filter 214, the color filter 216, and the color filter 220, respectively, impinges upon a predetermined diffractive element of the diffractive element 116 while the residual diffracted light falls onto neighboring diffractive elements of the diffractive element 116. Such images suitable for viewing in 3D are considered to be spatially multiplexed light fields.

Figure 3:
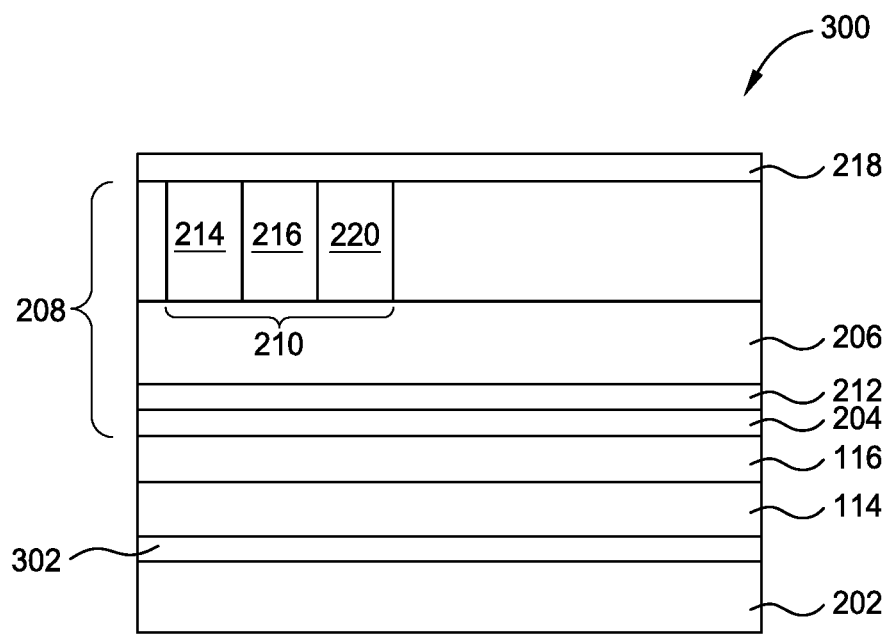
FIG. 3 illustrates a schematic view of a display stack according to an embodiment of the disclosure.

FIG. 3 illustrates a schematic view of a display stack 300 according to an embodiment of the disclosure. In one embodiment, the display stack 300 is configured to generate a three dimensional (3D) image in a viewing zone spaced from the display stack 300 at which all pixels of the display stack 300 are visible to the viewer. The display stack 300 is contemplated to be part of a 3D display apparatus which further includes one or more of an encapsulating glass layer, a touch film, antireflective coatings, and smudge resistant coatings or the like.

The display stack 300 includes the light source 202, the LCD module 208, the LCD cell 206, the collimator 114, the diffractive element 116, the LCD TFT backplane assembly 212 operable to drive the LCD cell 206, the pixel 210, and a quantum dot enhancement film (QDEF) 302. In one embodiment, the collimator 114 is coupled to and in optical communication with the light source 202. The diffractive element 116 is coupled to and in optical communication with the collimator 114. In one embodiment, the diffractive element 116 is disposed on and in contact with the collimator 114. The LCD TFT backplane assembly 212 is disposed between the diffractive element 116 and the LCD module 208. In one embodiment, the LCD TFT backplane assembly 212 is disposed on and in contact with the diffractive element 116. In another embodiment, the TFT backplane assembly 112 is disposed on and in physical contact and in electrical communication with the LCD cell 206.

The QDEF 302 is disposed between the light source 202 and the collimator 114. In one embodiment, the QDEF 302 is in optical communication with the light source 202 and the LCD module 208. In another embodiment, the QDEF 302 is disposed on an in contact with both of the light source 202 and the collimator 114. The QDEF 302 includes quantum dot particles dispersed throughout a film. The QDEF 302 is photoluminescent and emits light upon excitation of the particles from light propagating from the light source 202. It is contemplated that the QDEF 302 is utilized to enhance the color depth and/or color saturation characteristics of light propagating from the light source prior to propagation through the LCD module 208.

In operation, light emitted by the light source 202, which is diffuse in nature, propagates through the QDEF 302 and the collimator 114 where the light is collimated. The collimator 114 collimates the light at a near zero propagation angle that is incident on the diffractive element 116. The collimated light then propagates through the diffractive element 116 where the light is diffracted in a predetermined angular orientation to the LCD module 208 where the light color is modulated while maintaining the angular orientation to create an image or portion of an image suitable for viewing in 3D.

Light emanating from the diffractive element 116 is directed toward the color filters 214, 216, 220. In one embodiment, the color filters 214, 216, 220 are placed in a deterministic fashion about the diffractive element 116. For example, the red, green, and blue light diffracted by the diffractive element 116 impinges the color filters 214, 216, 220, respectively. In another embodiment, the color filters 214, 216, 220 are positioned in a probabilistic fashion about the diffractive element 116. For example, the red, green, and blue light diffracted by the diffractive element 116 impinges the color filters 214, 216, 220, respectively. Such images suitable for viewing in 3D are considered to be spatially multiplexed light fields.

Figure 4:
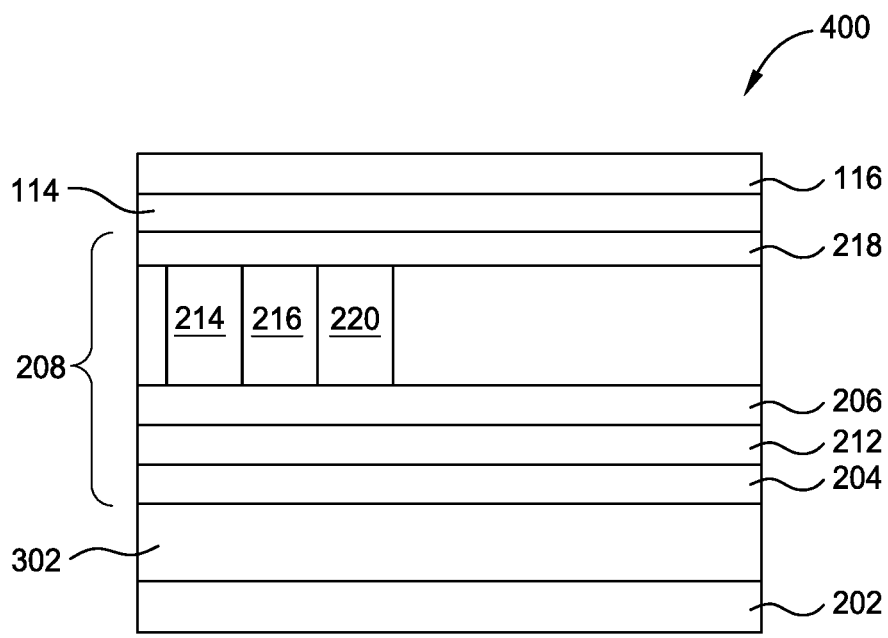
FIG. 4 illustrates a schematic view of a display stack according to an embodiment of the disclosure.

FIG. 4 illustrates a schematic view of a display stack 400 according to an embodiment of the disclosure. In one embodiment, the display stack 400 is configured to generate a three dimensional (3D) image in a viewing zone spaced from the display stack 400 at which all pixels of the display stack 400 are visible to the viewer. The display stack 400 is contemplated to be part of a 3D display apparatus which further includes one or more of an encapsulating glass layer, a touch film, antireflective coatings, and smudge resistant coatings or the like.

The display stack 400 includes the light source 202, the LCD module 208, the collimator 114, the diffractive element 116, the LCD module 208, and the QDEF 302. The LCD module 208 includes the first polarizer 204, the LCD TFT backplane assembly 212, the LCD cell 206, the pixel 210, and the second polarizer 218. In one embodiment, the second polarizer is crossed to the first polarizer 204. The pixel 210 includes the color filters 214, 216, 220. In this embodiment, the color filter 214 is a red color filter, the color filter 216 is a green color filter, and the color filter 220 is a blue color filter. In another embodiment, the color filter 220 is a polymer material with blue quantum dots disposed therein or a polymer material with minimal attenuation to blue light.

The order of color filters 214, 216, 220 (i.e. subpixels) are interchangeable. In one embodiment, the collimator 114 is coupled to and in optical communication with the light source 202. The diffractive element 116 is coupled to and in optical communication with the collimator 114. In one embodiment, the diffractive element 116 is disposed on and in contact with the collimator 114.

The LCD TFT backplane assembly 212 is coupled to the LCD cell 206 between the LCD cell 206 and the light source 202. In another embodiment, the LCD TFT backplane assembly 212 is disposed on and in physical contact and in electrical communication with the LCD module 208. Also disposed between the LCD module 208 and the light source 202 are the QDEF 302 and the first polarizer 204. In this embodiment, the QDEF is disposed on and in contact with the light source 202, the first polarizer 204 is disposed on and in contact with the QDEF 302, and the LCD TFT backplane assembly 212 is disposed on and in contact with the first polarizer 204. In this embodiment, the LCD module 208 is disposed on and in contact with the QDEF 302.

The quantum dot film 220 is disposed between the collimator 114 and the LCD module 208. In one embodiment, the quantum dot film 220 is disposed on and in contact with both of the LCD module 208 and the collimator 114. In embodiments where the display stack 400 utilizes both the QDEF 302 and the quantum dot film 220, color depth and color saturation characteristics of light propagating through the display stack 400 may be further improved. However, in certain embodiments, it is contemplated that one or both of the QDEF 302 and the quantum dot film 220 are optional, depending upon the desired implementation.

In operation, light emitted by the light source 202, which is diffuse in nature, propagates through the QDEF 302 to the LCD module 208 where the light color is modulated. The light further propagates through the quantum dot film 220 and to the collimator 114 where the light is collimated. The collimator 114 collimates the light at a near zero propagation angle that is incident on the diffractive element 116. The collimated light then propagates through the diffractive element 116 where the light is diffracted in a predetermined angular orientation to create an image or portion of an image suitable for viewing in 3D.

Light emanating from the individual color filters 214, 216, 220 is directed toward a specific diffractive element of the diffractive element 116. In one embodiment, the diffractive element 116 is placed in a deterministic fashion about the color filters 214, 216, 220. For example, near 100% of the light emanating from the color filters 214, 216, 220 impinges upon a predetermined diffractive element pixel. In another embodiment, the diffractive element 116 is placed in a probabilistic fashion about the color filters 214, 216, 220. For example, the red, green, and blue light emanating from color filter 214, the color filter 216, and the color filter 220, respectively, impinges a predetermined diffractive element of the diffractive element 116 while residual diffracted light falls onto the neighboring diffractive elements of the diffractive element 116. Such images suitable for viewing in 3D are considered to be spatially multiplexed light fields.

Figure 5A:
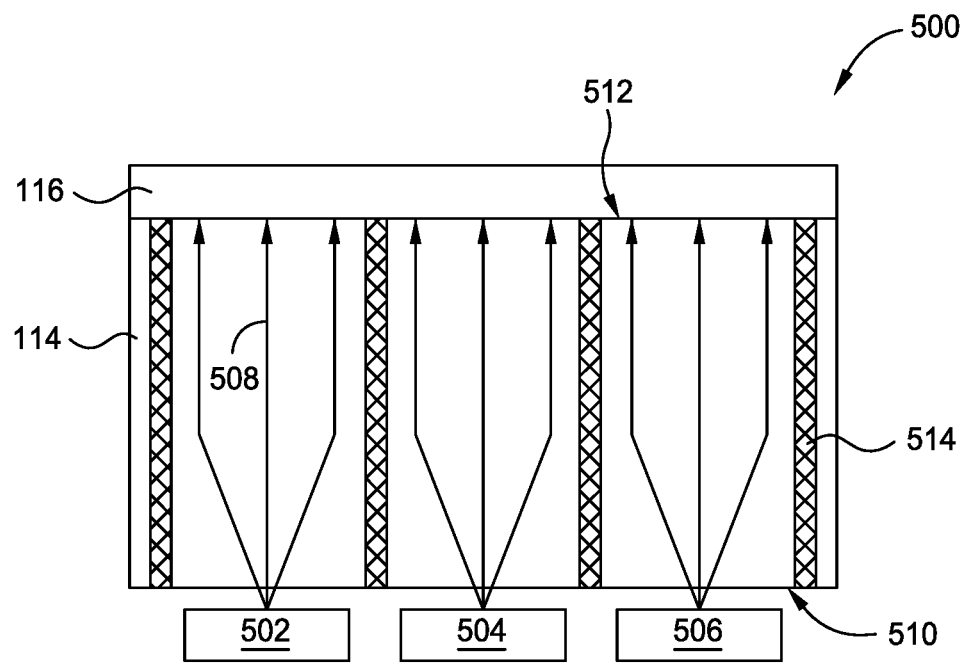
FIG. 5A illustrates a schematic view of a light guide according to an embodiment of the disclosure.

FIG. 5A illustrates a schematic view of a light guide 500 according to an embodiment of the disclosure. In one embodiment, the light guide 500 may be utilized as the collimator 114 and diffractive element 116 described with regard to any of FIGS. 1, 2, 3, and 4. The light guide 500 includes the collimator 114 and the diffractive element 116. In one embodiment, light sources 502, 504, 506 are intended to be representative of a light source, such as the light sources 106, 108, 110 described with regard to FIG. 1. In this embodiment, the light source 502 is a red light source, the light source 504 is a green light source, and the light source 506 is a blue light source. In another embodiment, the light sources 502, 504, 506 are intended to be representative of color filters which modulate light propagating from a light source, such as the color filters 214, 216 of the LCD module 208 described with regard to FIGS. 2, 3, and 4. In this embodiment, the light source 502 is a red color filter, the light source 504 is a green color filter, and the light source 506 is a color filter which does not substantially modulate the wavelength of blue light.

Light 508, which may be diffuse in nature, is emitted from the light sources 502, 504, 506. The light 508 is incident on a first surface 510 of the collimator 114. A plurality of collimating structures 514 are disposed within the collimator 114. In one embodiment, the collimating structures 514 extend from the first surface 510 to a second surface 512 of the collimator 514. The collimating structures 514 are disposed in a substantially linear orientation between the first surface 510 and the second surface 512.

Each collimating structure of the plurality of collimating structures 514 is positioned between two of the light sources 502, 504, 506 which are adjacent to one another. Thus, light 508 emitted from one of the light sources, for example, light source 502, is separated from light 508 emitted from the adjacent light source, such as light source 504. Similarly, the collimating structures 514 separate light 508 emitted from the light source 504 from light 508 emitted from the light source 506. It is contemplated that the collimating structures 514 collimate the light 508 with an acceptance angle of up to about 20°.

In one embodiment, the collimating structures 514 comprise ridges formed on the collimator 114. In another embodiment, the collimating structures 514 comprise grooves formed in the collimator 114. In one embodiment, a cross-sectional constitution of the collimating structures is rectangular or square. In another embodiment, a cross-sectional constitution of the collimating structures 514 is polygonal, for example, pyramidal in shape. In one embodiment, surfaces of the collimating structures 514 are absorptive. In another embodiment, surfaces of the collimating structures are reflective.

In one embodiment, a first material is utilized to fabricate the collimator 114 and a second material is utilized to fabricate the collimating structures 514. For example, the first material may be a metallic material and the second material may be a dielectric material, or vice versa. In another embodiment, two different dielectric materials are utilized to fabricate the collimator 114 and the collimating structures 514. In this embodiment, the first and second materials may be selected to improve collimation characteristics resulting from the difference in refractive index between the first and second materials.

In operation, the collimating structures 514 collimate a spatial profile of the light 508 propagating form the light sources 502, 504, 506 such that when the light 508 is incident on the second surface 512 of the collimator 114, the light 508 is substantially orthogonal to the second surface 512. The collimated light 508 then propagates through the diffractive element 116 where the light 508 is diffracted with a predetermined angular orientation.

Figure 5B:
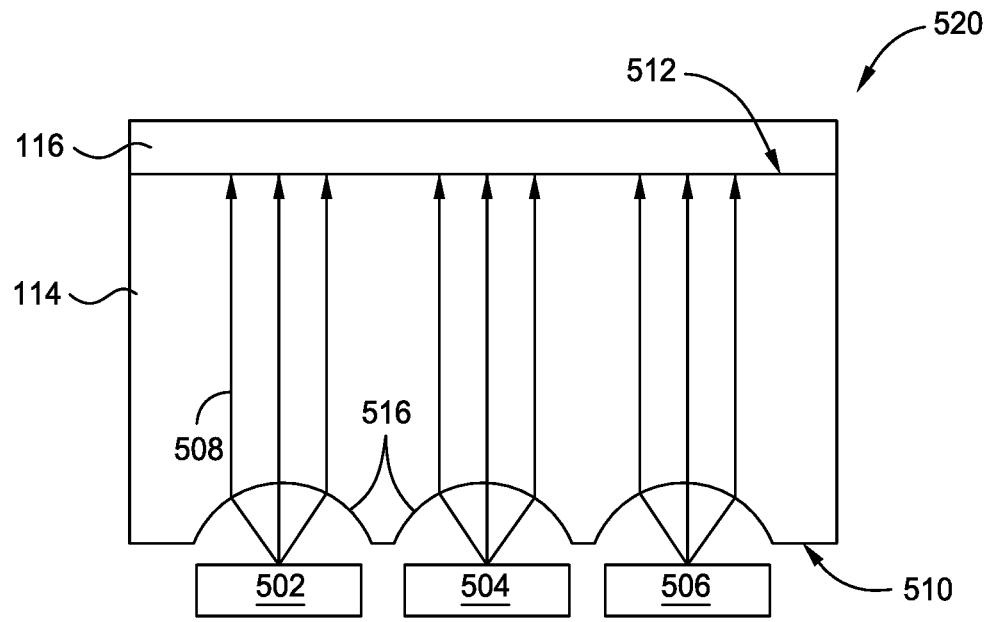
FIG. 5B illustrates a schematic view of a light guide according to an embodiment of the disclosure.

FIG. 5B illustrates a schematic view of a light guide 520 according to an embodiment of the disclosure. In one embodiment, the light guide 520 may be utilized as the collimator 114 and the diffractive element 116 described with regard to any of FIGS. 1, 2, 3, and 4. The light guide 520 functions similarly to the light guide 500 by collimating the spatial profile of the light 508 propagating from the light sources 502, 504, 506 through the collimator 114 to the diffractive element 116. The collimator 114 includes collimating structures 516 which are formed in the first surface 510 of the collimator 114. Each of the collimating structures 514 are aligned in a propagation path of the light 508 emitted from each of the light sources 502, 504, 506. Similar to the collimating structures 514, the collimating structures 516 are configured to collimate the light 508 with an acceptance angle of up to about 20°.

The collimating structures 516 are textured features of the first surface 510. In the illustrated embodiment, the collimating structures 516 are fabricated with a cross-sectional morphology comprising an arc or a segment of an arc. In this embodiment, the collimating structures 516 may have a radius or a portion of a radius. In other embodiments, the morphology of the collimating structures 516 formed in the first surface 510 of the collimator 114 includes, but is not limited to, aspherical morphologies, ellipsoidal morphologies, pyramidal morphologies, and the like. In some embodiments, the collimating structures 514 include ridges formed on the collimator 114 of FIG. 5A and can be used in conjunction with the textured features for collimation as illustrated in FIG. 5B.

In operation, the light 508 propagating from the light sources 502, 504, 506 is incident on the collimating structures 516 formed in the first surface 510 of the collimator 114. The collimating structures 516 collimate the light 508 such that the light 508 is substantially orthogonal to the second surface 512. In one embodiment, the light propagation direction is less than a critical angle of the material utilized to fabricate the collimator 114. The collimated light 508 then propagates through the diffractive element 116 where the light 508 is diffracted with a predetermined angular orientation.

FIG. 5C illustrates a schematic view of a light guide 530 according to an embodiment of the disclosure. In one embodiment, the light guide 530 may be utilized as the collimator 114 and diffractive element 116 described with regard to any of FIGS. 1, 2, 3, and 4. The light guide 530 functions similarly to the light guides 500, 520 by collimating the spatial profile of the light 508 propagating from the light sources 502, 504, 506 through the collimator 114 to the diffractive element 116.

In one embodiment, the light guide 530 includes collimating structures 518 coupled to the collimator 114. In one embodiment, the collimating structures 518 are formed in the collimator 114 such that the collimating structures 518 for the first surface 510 of the collimator 114. In another embodiment, the collimating structures 518 are formed on and in contact with the first surface 510 of the collimator 114. In some embodiments, the collimating structures 514 include ridges formed on the collimator 114 as illustrated in FIG. 5A and can be utilized in conjunction with the metamaterials or photonic crystals for collimation as illustrated in FIG. 5C.

The collimating structures 518 are formed as a film on the collimator 114. In one embodiment, the collimating structures 518 utilize diffraction to collimate the spatial profile of the light 508. In this embodiment, the collimating structures 518 comprise diffractive elements, such as metamaterials, gratings, or photonic crystals. In embodiments where the collimating structures 518 are metamaterials, the metamaterials are selected to exhibit an effective refractive index of zero or close to zero. In embodiments where the collimating structures 518 are photonic crystals, the photonic crystals are selected to exhibit a flat band dispersion. Similar to the collimating structures 514, 516, the collimating structures 518 collimate the light 508 such that the light 508 is substantially orthogonal to the second surface 512. The collimated light 508 then propagates through the diffractive element 116 where the light 508 is diffracted with a predetermined angular orientation.

In embodiments where the collimating structures 518 are fabricated from metamaterials, the metamaterials are composite materials having morphologies adapted to collimate the light 508 propagating therethrough. In embodiments wherein the collimating structures 518 are gratings, the gratings may have varying morphologies with fill factors, thicknesses, periods and combinations thereof selected to collimate the light 508 propagating therethrough. In embodiments, wherein the collimating structures 518 are photonic crystals, the photonic crystals may be 1 dimensional, 2 dimensional, or 3 dimensional photonic crystals comprising optical nanostructures selected to collimate the light 508 propagating therethrough. In the embodiments of FIG. 5C, the collimating structures 518 also include materials having an index of refraction which is different than an index of refraction of the collimator 114. It is believed that by varying the index of refraction, in combination with the morphological characteristics of the collimating structures 518, collimation of the spatial profile of the light 508 propagating from the light sources 502, 504, 506 to the diffractive element 116 is improved.

FIG. 6 illustrates a schematic view of the diffractive element 116 according to an embodiment of the disclosure. Depending upon the desired implementation, the diffractive element 116 is a 1 dimensional grating, a 2 dimensional grating, or a 3 dimensional grating. The diffractive element 116 modulates light received from the collimator 114 by focusing diffracted rays of light in a predefined angular direction. This light modulation is utilized to generate an image at a viewing zone spaced from the diffractive element 116 (described in greater detail with regard to FIGS. 9A-9B).

In one embodiment, the diffractive element 116 includes a plurality of gratings 604 disposed on a surface 602 of the diffractive element 116. When the diffractive element 116 is coupled to the collimator 114, the surface 602 is disposed opposite the collimator 114 such that light propagates through the diffractive element 116 before passing through the top surface 602. The diffractive element 116 is fabricated from a substantially optically transparent material. In one embodiment, the diffractive element 116 is fabricated from a material that has a refractive index similar to a refractive index of either the collimator 114 or the collimating structures 514, 516, 518. In another embodiment, the diffractive element 116 is fabricated from a material that has a refractive index different from the refractive index of either the collimator 114 or the collimating structures 514, 516, 518.

In one embodiment, the plurality of gratings 604 are disposed on the surface 602 of the diffractive element 116 with an angular orientation. For example, the gratings 604 are disposed at an angle θ from an axis normal to the surface 602, as illustrated in FIG. 6A. In FIG. 6A, the gratings 604 have a substantially parallelogram cross section, however, other morphologies, such as blazed, sinusoidal, or the like, may be utilized. For example, the gratings 604 extend linearly from the surface 602. In another embodiment, the gratings 604 are curved or approximate a curve using linear segments that extend along the surface 602. In yet another embodiment, a morphology of the gratings 604 is such that the gratings 604 may be considered sub-wavelength gratings.

FIGS. 6B-6D illustrate a schematic top view of the diffractive element 116 according to some embodiments. In FIGS. 6B-6D, the plurality of gratings 604 is disposed at an angle φ from an outer edge 610 of the diffractive element 116. For example, in FIG. 6B, the angle φ is equal to 0, and thus the plurality of gratings 604 is disposed on the surface 602 substantially parallel to the outer edge 610. In FIGS. 6C and 6D, the angles $\phi_1$ and $\phi_2$ are increasingly greater than 0, and thus the plurality of gratings 604 is disposed diagonally across the surface 602 of the diffractive element 116. Angle $\phi_2$ is greater than angle $\phi_1$, and thus, the gratings 604 are disposed at a greater angle of divergence from the outer edge 610 in FIG. 6D than in 6C. Although the gratings 604 extend linearly across the surface 602 of the diffractive element 116 in FIGS. 6B-6D, other morphologies, such as curved, jagged, or the like, may be utilized.

The gratings 604, which extend from the top surface 602, are spaced apart from adjacent gratings 604. A groove 606 is disposed between each adjacent grating 604. In one embodiment, the groove 606 is substantially devoid of material. In another embodiment, the groove 606 is filled with a material having a refractive index different than a refractive index of the material utilized to form the gratings 604. It is contemplated that various fabrication techniques, such as angled etching processes, such as e-beam or ion etching processes, nanoimprint lithography, or other suitable processes may be utilized to fabricate the gratings 604.

Figure 7A:
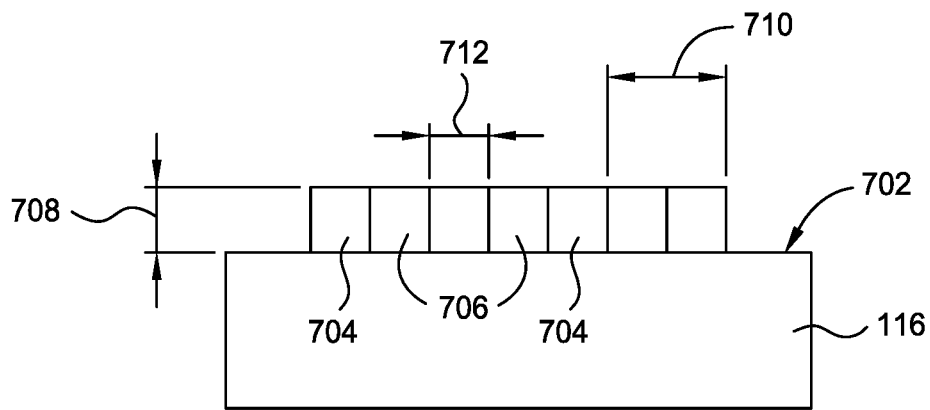
FIG. 7A illustrates a schematic view of a diffractive element according to an embodiment of the disclosure.

FIG. 7A illustrates a schematic view of the diffractive element 116 according to an embodiment of the disclosure. The diffractive element 116 modulates light received from the collimator 114 by focusing diffracted rays of light in a predefined angular direction. This light modulation is utilized to generate an image at a viewing zone spaced from the diffractive element 116 (described in greater detail with regard to FIGS. 9A-9B).

In one embodiment, the diffractive element 116 includes a plurality of gratings 704 and grooves 706 disposed on a surface 702 of the diffractive element 116. When the diffractive element 116 is coupled to the collimator 114, the surface 702 is disposed opposite the collimator 114 such that light propagates through the diffractive element 116 before passing through the top surface 702. In one embodiment, the gratings 704 are disposed on and extend from the surface 702. In this embodiment, the gratings 704 are fabricated from a material having a refractive index different than a refractive index of the material utilized to fabricate the diffractive element 116. For example, the material utilized to fabricate the gratings 704 has a refractive index greater than a refractive index of the groove 706. In another embodiment, the gratings 704 are fabricated from a material having a refractive index substantially similar or equal to the refractive index of the material utilized to fabricate the diffractive element 116.

The grooves 706 and gratings 704 are disposed on the top surface 702 in an alternating manner. In one embodiment, the grooves 706 are substantially devoid of any material. In another embodiment, the grooves 706 are fabricated from a material have a refractive index different from the refractive index of the material utilized to fabricate the gratings 704. Similar to the gratings 604 and grooves 606, the morphology of the gratings 704 and grooves 706 may be selected in response to desired light diffraction characteristics.

The gratings 704 and grooves 706 have a height 708 which is a height extending above the surface 702. The gratings 704 and grooves 706 also have a fill factor 712 corresponding to a cross-sectional width. The gratings 704 and grooves 706 further have a period 710 corresponding to a summation of cross-sectional widths of a single grating 704 and a single groove 706. It is contemplated that the height 708, the period 710, and the fill factor 712 may be individually varied to achieve a morphology of the gratings 704 and grooves 706 depending upon the desired diffractive characteristics.

Figure 7B:
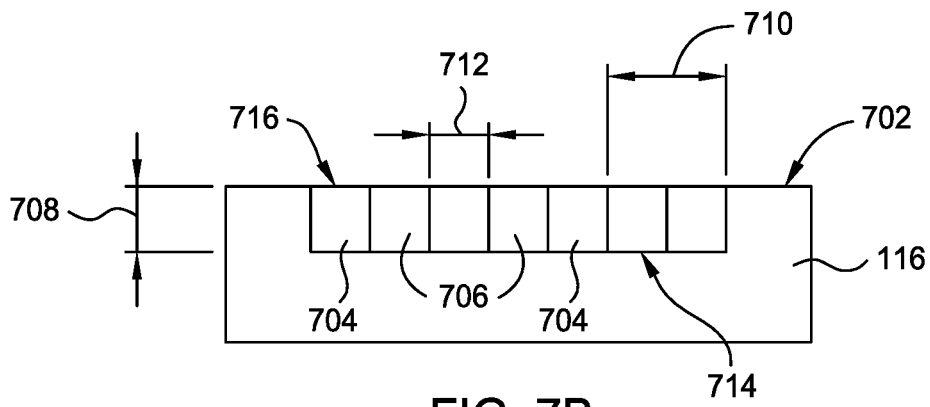
FIG. 7B illustrates a schematic view of a diffractive element according to an embodiment of the disclosure.

FIG. 7B illustrates a schematic view of the diffractive element 116 according to an embodiment of the disclosure. In the illustrated embodiment, a surface 714 is recessed below the surface 702 of the diffractive element 116. The gratings 704 and grooves 706 are disposed on the surface 714 and extend the height 708 such that a top surface 716 of the gratings 704 and grooves 706 are substantially coplanar with the surface 702.

Figure 7C:
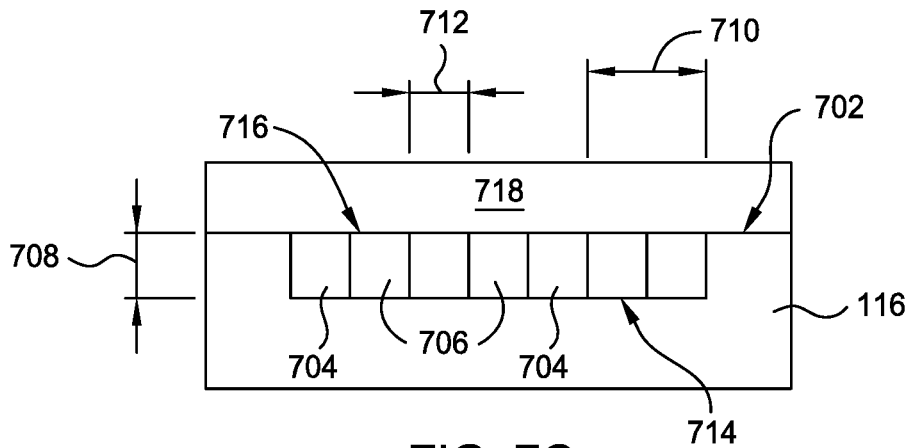
FIG. 7C illustrates a schematic view of a diffractive element according to an embodiment of the disclosure.

FIG. 7C illustrates a schematic view of the diffractive element 116 according to an embodiment of the disclosure. The diffractive element 116 is similar to the diffractive element illustrated in FIG. 7B. In the illustrated embodiment, an encapsulation layer 718 is disposed over the diffractive element 116. For example, the encapsulation layer 718 disposed on the surface 702 and the surface 716 and extends laterally across the surfaces 702, 716. In one embodiment, the material of the encapsulation layer 718 extends partially or entirely into the groove 706. Alternatively, the groove 706 remains free or substantially free of the material of the encapsulation layer 718. In one embodiment, the encapsulation layer 718 is an antireflective coating. In this embodiment, it is contemplated that the antireflective coating functions to prevent diffractive distortions due to the possible presence of reflected light within the diffractive element 116 or other elements of a display stack or exterior environmental light sources.

Figure 8A:
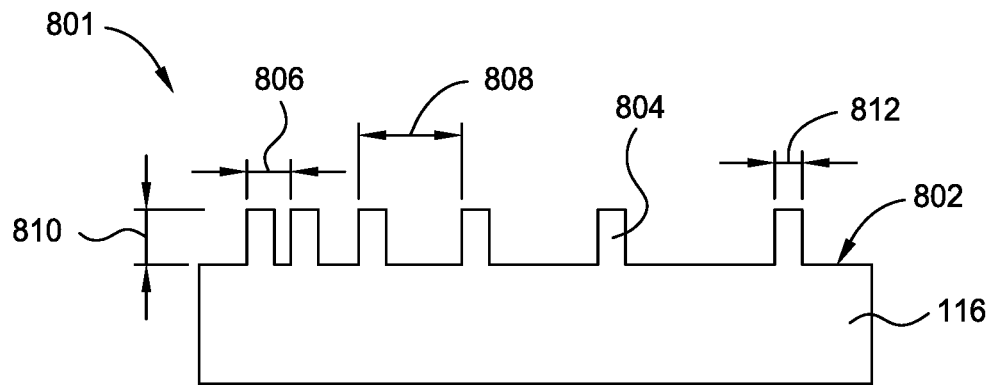
FIG. 8A illustrates a schematic view of a diffractive element having chirped gratings according to an embodiment described herein.

FIG. 8A illustrates a schematic view of the diffractive element 116 having chirped gratings 801 according to an embodiment described herein. The diffractive element 116 includes a surface 802 and a plurality of gratings 804 extending from the surface 802. Each of the gratings 804 has a uniform height 810 and a uniform fill factor 812. In one embodiment, the fill factor is a width of a high index material in a given period. In the illustrated embodiment, the periodicity (i.e. sum of the width of the high refractive index ridge and low refractive index groove) of the gratings 804 is modulated. For example, the gratings 804 have a first period 806 and a second period 808 which is greater than the first period 806. Alternatively, the gratings 804 have the first period 806 and the second period 808 which is smaller than the first period 806. The varying periodicity may be linear, quadratic, Gaussian, exponential, or inverse exponential and may include all gratings 804 formed on the diffractive element 116.

Figure 8B:
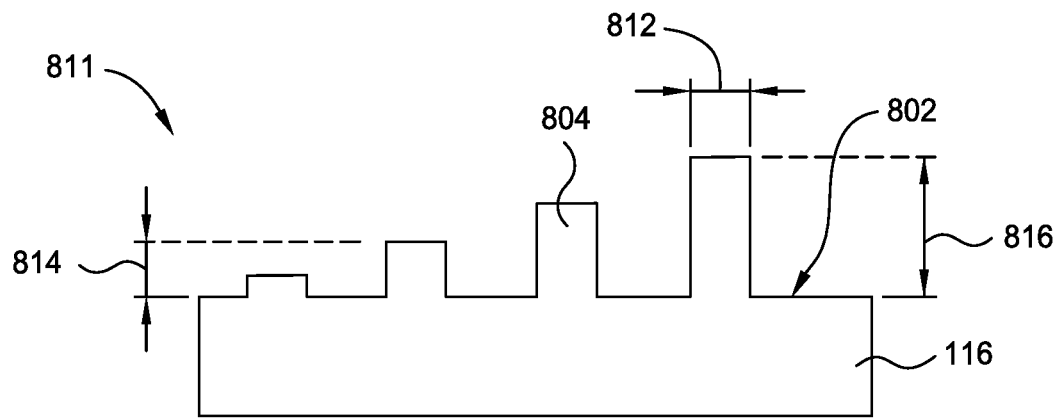
FIG. 8B illustrates a schematic view of a diffractive element having chirped gratings according to an embodiment described herein.

FIG. 8B illustrates a schematic view of the diffractive element 116 having chirped gratings 811 according to an embodiment described herein. Each of the gratings 804 has a uniform periodicity and a uniform fill factor 812. In the illustrated embodiment, the height of the gratings 804 is modulated. For example, the gratings 804 have a first height 814 and a second height 816 which is greater than the first height 814. Alternatively, the gratings 804 have the first height 814 and the second height 816 which is smaller than the first height 814. The varying height may be linear, quadratic, Gaussian, exponential, or inverse exponential and may include all gratings 804 formed on the diffractive element 116.

Figure 8C:
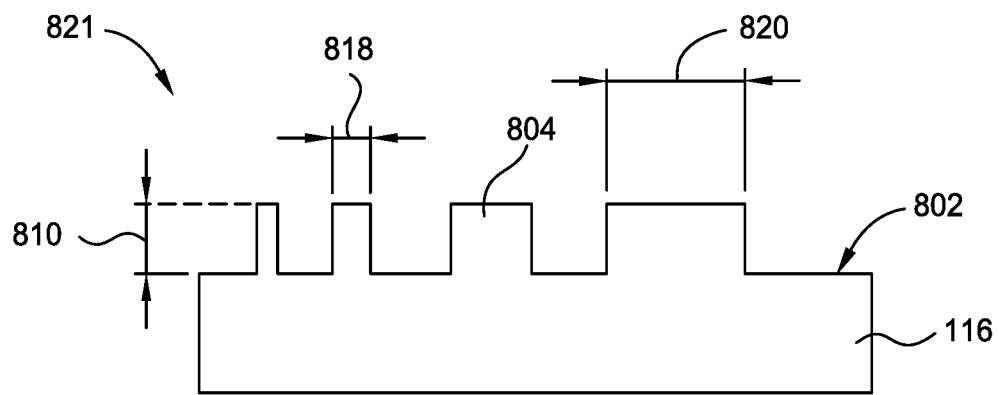
FIG. 8C illustrates a schematic view of a diffractive element having chirped gratings according to an embodiment described herein.

FIG. 8C illustrates a schematic view of the diffractive element 116 having chirped gratings 821 according to an embodiment described herein. Each of the gratings 804 has a uniform height 810 and a uniform periodicity. In the illustrated embodiment, the fill factor of the gratings 804 is modulated. For example, the gratings 804 have a first fill factor 818 and a second fill factor 820 which is greater than the first fill factor 818. Alternatively, the gratings 804 have the first fill factor 818 and the second fill factor 820 which is smaller than the first fill factor 818. The varying fill factor may be linear, quadratic, Gaussian, exponential, or inverse exponential and may include all gratings 804 formed on the diffractive element 116.

Utilizing chirped gratings, such as the gratings 801, 811, 821, enables focusing different diffracted colors on the same viewing zone or different viewing zones, depending upon the desired implementation and image display characteristics. Utilization of chirped gratings also enables separation or combination of different colors of diffracted light. Thus, potentially infinite color combinations may be generated via diffracted light combination. Similarly, a single color may be generated via diffracted light separation. Although FIGS. 8A-8C illustrate modulation of a single chirp factor, it is contemplated that varying each of the periodicity, height, and fill factor on a single diffractive element may be utilized to further modulate light diffraction characteristics of the diffractive elements.

Figure 9A:
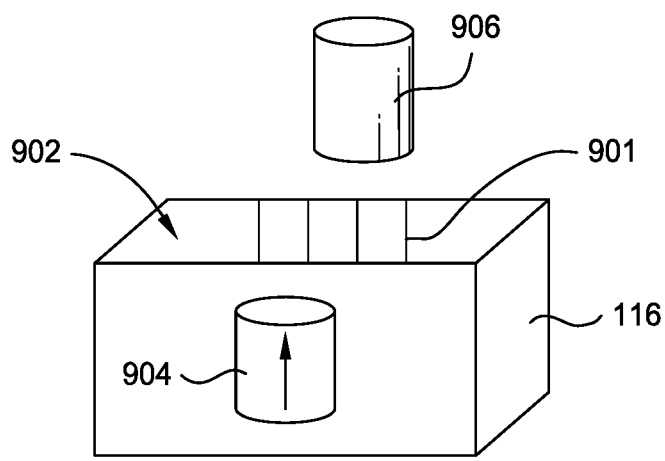
FIG. 9A is a schematic perspective view of a diffractive element and an image displayed in three dimensions according to an embodiment described herein.

FIG. 9A is a schematic perspective view of the diffractive element 116 and an image 906 displayed in three dimensions according to an embodiment described herein. The diffractive element 116 includes gratings 901 having a first morphology, which are representative of the various grating embodiments described herein, formed on a surface 902 of the diffractive element 116. In one embodiment, the diffractive element 116 includes the gratings 901 having 1 dimensional periodicity, which can be extended to 2 dimensional and 3 dimensional periodicity, formed on the surface 902 of the diffractive element 116. Collimated light 904 is illustrated as propagating through the diffractive element 116. As the collimated light 904 propagates through the gratings 901, the collimated light 904 is diffracted in a first predefined angular direction to form the image 906 at a desired viewing zone spaced apart from the surface 902.

Figure 9B:
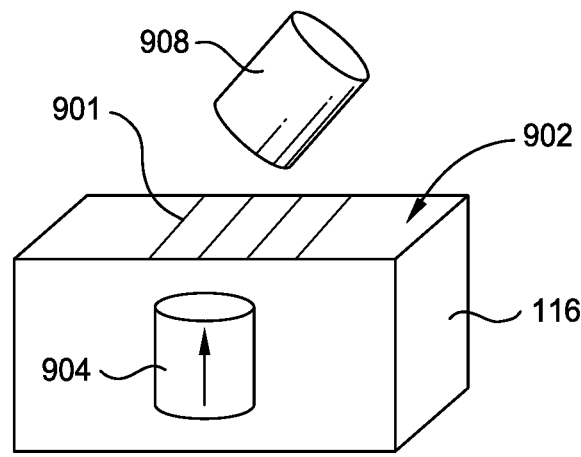
FIG. 9B is a schematic perspective view of a diffractive element and an image displayed in three dimensions according to an embodiment described herein.

FIG. 9B is a schematic perspective view of the diffractive element 116 and an image 908 displayed in three dimensions according to an embodiment described herein. The diffractive element 116 includes gratings 901 having a second morphology different from the first morphology, which are representative of the various grating embodiments described herein. The gratings 901 are formed on a surface 902 of the diffractive element 116. In one example, the gratings 901 having the second morphology are angled (or chirped) differently than the gratings 901 described in FIG. 9A.

Collimated light 904 is illustrated as propagating through the diffractive element 116. As the collimated light 904 propagates through the gratings 901, the collimated light 904 is diffracted in a second predefined angular direction to form the image 908 at a desired viewing zone spaced apart from the surface 902. Due to the morphological characteristics of the gratings 901 having the second morphology, the image 908, which is comprised of the same light input as the image 906, has a different orientation in space than the first image 906.

Figure 9C:
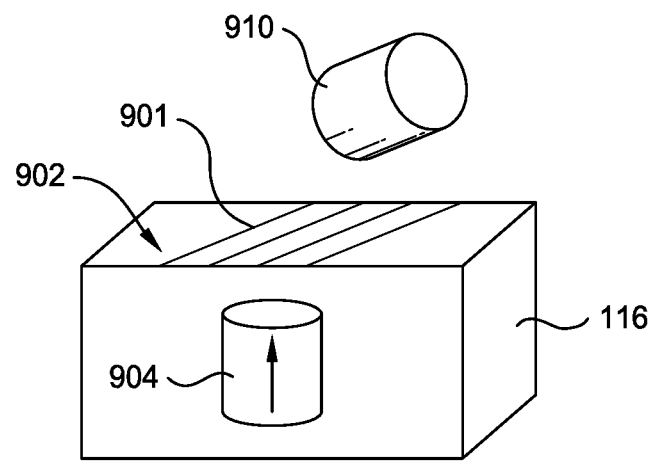
FIG. 9C is a schematic perspective view of a diffractive element and an image displayed in three dimensions according to an embodiment described herein.

FIG. 9C is a schematic perspective view of the diffractive element 116 and an image 910 displayed in three dimensions according to an embodiment described herein. The diffractive element 116 includes gratings 901 having a third morphology different from the first or the second morphology, which are representative of the various grating embodiments described herein. The gratings 901 are formed on a surface 902 of the diffractive element 116. In one example, the gratings 901 having the third morphology are angled (or chirped) differently than the gratings 901 described in FIG. 9A and FIG. 9B.

Collimated light 904 is illustrated as propagating through the diffractive element 116. As the collimated light 904 propagates through the gratings 901, the collimated light 904 is diffracted in a third predefined angular direction to form the image 910 at a desired viewing zone spaced apart from the surface 902. Due to the morphological characteristics of the gratings 901 having the third morphology, the image 910, which is comprised of the same light input as the images 906, 908, has a different orientation in space than either of the first image 906 or the second image 908.

Although FIGS. 9A-9C illustrate diffraction of light in three different predefined angular direction, a plurality of diffractive elements can be utilized to form the image 910 in substantially any desired viewing zone with substantially infinite orientations and variations thereof. Thus, it is contemplated that collimators and diffractive elements described herein may be utilized in various display stacks to fabricate displays suitable for generation of 3D images.

While the foregoing is directed to embodiments of the present disclosure, other and further embodiments of the disclosure may be devised without departing from the basic scope thereof, and the scope thereof is determined by the claims that follow.

What is claimed is:

1. A display apparatus, comprising:
a polychromatic backlight unit comprising a plurality of emissive light sources;
a collimator comprising a plurality of collimating features in contact with and in optical communication with the backlight unit, the collimator forming separate light propagation pathways for each of the emissive light sources, the light propagation pathways having a near zero propagation angle;
a thin film transistor (TFT) backplane assembly in contact with the backlight unit on a side of the backlight unit opposite the collimator, the TFT backplane assembly operable to drive the backlight unit; and
a diffractive element comprising a plurality of gratings in contact with and in optical communication with the collimator.

2. The apparatus of claim 1, wherein the plurality of emissive light sources comprises one or more of a light emitting diode (LED) light source, an organic light emitting diode (OLED) light source, a micro LED light source, a quantum dot on glass (QDOG) light source, a laser light source, and a diode light source.

3. The apparatus of claim 1, further comprising:
a polarizer disposed between the backlight unit and the collimator.

4. The apparatus of claim 1, wherein the backlight unit comprises at least a red emitting diode, a blue emitting diode, and a green emitting diode.

5. The apparatus of claim 4, wherein a first collimating feature of the plurality of collimating features is configured to collimate light emitted from the red emitting diode, a second collimating feature of the plurality of collimating features is configured to collimate light emitted from the blue emitting diode, and a third collimating feature of the plurality of collimating features is configured to collimate light emitted from the green emitting diode.

6. The apparatus of claim 5, wherein the plurality of collimating features comprises a plurality of ridges formed in the collimator and extending from a surface of the collimator in contact with the backlight unit to a surface of the collimator in contact with the diffractive element.

7. A display apparatus, comprising:
a monochromatic backlight unit comprising an emissive light source;
a liquid crystal display (LCD) module coupled to and in optical communication with the backlight unit, the LCD module comprising a plurality of color filters to modulate a wavelength of light emitted from the backlight unit to generate desired light colors;
a first thin film transistor (TFT) backplane assembly disposed between the backlight unit and the LCD module, the first TFT backplane assembly in contact with the LCD module;
a collimator comprising a plurality of collimating features in contact with and in optical communication with the LCD module on a side of the LCD module opposite the first TFT backplane assembly, the collimator forming separate light propagation pathways for each of the light colors generated by the color filters, the light propagation pathways having a near zero propagation angle; and
a diffractive element comprising a plurality of gratings in contact with and in optical communication with the collimator.

8. The apparatus of claim 7, further comprising:
a quantum dot color filter disposed between the LCD module and the collimator.

9. The apparatus of claim 7, wherein the emissive light source comprises a diode light source selected from a group consisting of a light emitting diode (LED) light source, an organic light emitting diode (OLED) light source, a micro LED light source, and a laser diode light source.

10. The apparatus of claim 7, wherein a first collimating feature of the plurality of collimating features is configured to collimate light emitted from a quantum dot enhancement film.

11. The apparatus of claim 7, wherein the plurality of collimating features comprises a plurality of ridges formed in a surface of the collimator in contact with the LCD module and a surface of the collimator in contact with the diffractive element.

12. The apparatus of claim 7, wherein a first collimating feature of the plurality of collimating features is configured to collimate light emitted from a red color filter, a second collimating feature of the plurality of collimating features is configured to collimate light emitted from a green color filter, and a third collimating feature of the plurality of collimating features is configured to collimate light emitted form a blue color filter.

13. The apparatus of claim 7, further comprising:
a second TFT backplane assembly in contact with the backlight unit on a side of the backlight unit opposite the collimator, the second TFT backplane assembly operable to drive the backlight unit.

14. A display apparatus, comprising:

a monochromatic backlight unit comprising an emissive light source;

a quantum dot containing film in contact with the backlight unit;

a liquid crystal display (LCD) module in optical communication with the backlight unit;

a thin film transistor backplane assembly in contact with the LCD module and disposed between the LCD module and the quantum dot containing film;

a collimator comprising a plurality of collimating features in optical communication with the LCD module, the collimator disposed between the LCD module and the backlight unit, the plurality of collimating features oriented to collimate light emitted from the backlight unit at a near zero propagation angle; and a diffractive element comprising a plurality of gratings in contact with and in optical communication with the collimator.

15. The apparatus of claim 14, wherein the quantum dot containing film is disposed between the backlight unit and the collimator.

16. The apparatus of claim 14, wherein the thin film transistor backplane assembly is in contact with the diffractive element and the LCD module.

17. The apparatus of claim 14, wherein the quantum dot containing film is disposed between the backlight unit and the thin film transistor backplane assembly.

18. The apparatus of claim 14, further comprising:

a polarizer coupled to and in optical communication with the LCD module.

19. The apparatus of claim 14, wherein the plurality of collimating features comprises a plurality of ridges formed in the collimator and extending from a surface of the collimator which is disposed adjacent to the LCD module and the diffractive element.

20. The apparatus of claim 14, wherein the emissive light source comprises a diode light source selected from a group consisting of a light emitting diode (LED) light source, an organic light emitting diode (OLED) light source, a micro LED light source, and a laser diode light source.

* * * * *